United States Patent
Iwasaki et al.

(10) Patent No.: US 7,928,633 B2
(45) Date of Patent: Apr. 19, 2011

(54) ELASTIC WAVE ELEMENT CONTAINING A SILICON OXIDE FILM AND A SILICON NITRIDE OXIDE FILM

(75) Inventors: Yukio Iwasaki, Osaka (JP); Hiroki Kamiguchi, Osaka (JP); Yosuke Hamaoka, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/532,426

(22) PCT Filed: May 9, 2008

(86) PCT No.: PCT/JP2008/001165
§ 371 (c)(1),
(2), (4) Date: Sep. 22, 2009

(87) PCT Pub. No.: WO2008/146449
PCT Pub. Date: Dec. 4, 2008

(65) Prior Publication Data
US 2010/0060101 A1    Mar. 11, 2010

(30) Foreign Application Priority Data

May 25, 2007  (JP) .................... 2007-138591
Mar. 27, 2008  (JP) .................... 2008-082801

(51) Int. Cl.
  *H01L 41/04* (2006.01)
  *H03H 9/145* (2006.01)
(52) U.S. Cl. .................................................. 310/313 R
(58) Field of Classification Search .............. 310/313 B, 310/313 R
See application file for complete search history.

(56) References Cited

U.S. PATENT DOCUMENTS

| | | | | |
|---|---|---|---|---|
| 6,486,591 B2* | 11/2002 | Nishihara | ........ | 310/364 |
| 6,831,340 B2* | 12/2004 | Araki | ............ | 257/416 |
| 7,327,071 B2* | 2/2008 | Nishiyama et al. | ....... | 310/313 A |
| 2002/0140316 A1* | 10/2002 | Yamanouchi | ............ | 310/313 A |
| 2003/0080649 A1 | 5/2003 | Araki | | |
| 2003/0122453 A1* | 7/2003 | Yamada et al. | .......... | 310/363 |
| 2009/0267449 A1* | 10/2009 | Goto et al. | ............ | 310/313 R |

FOREIGN PATENT DOCUMENTS

| | | | |
|---|---|---|---|
| JP | 08330881 A | * | 12/1996 |
| JP | 09260366 A | * | 10/1997 |
| JP | 2003-198321(A) | | 7/2003 |
| JP | 2003-209458(A) | | 7/2003 |
| JP | 2005-348139(A) | | 12/2005 |

OTHER PUBLICATIONS

International Search Report for PCT/JP2008/001165 dated Jun. 10, 2008.

\* cited by examiner

*Primary Examiner* — J. SanMartin
(74) *Attorney, Agent, or Firm* — RatnerPrestia

(57) ABSTRACT

An elastic wave element includes a piezoelectric substrate, an interdigital electrode provided on the piezoelectric substrate, a silicon oxide film covering the interdigital electrode, and a silicon nitride oxide film provided on the silicon oxide film. A film thickness H of the silicon oxide film and a wave length $\lambda$ of an elastic wave propagating through the piezoelectric substrate satisfies a relation of $H/\lambda \geq 0.15$. The elastic wave element reduces fluctuation of propagation characteristics of elastic waves, and has high reliability.

3 Claims, 1 Drawing Sheet

ELASTIC WAVE ELEMENT CONTAINING A SILICON OXIDE FILM AND A SILICON NITRIDE OXIDE FILM

This application is a U.S. National Phase Application of PCT International Application PCT/JP2008/001165.

TECHNICAL FIELD

This invention relates to an elastic wave element including a piezoelectric substrate.

BACKGROUND ART

An elastic wave element described in Patent Document 1 includes a piezoelectric substrate, an interdigital electrode provided on the piezoelectric substrate, and a silicon oxide film provided on the interdigital electrode. In order to improve temperature characteristics of the piezoelectric substrate, the silicon oxide film has a smaller thermal expansion coefficient than the piezoelectric substrate, accordingly reducing a thermal expansion of the piezoelectric substrate due to a change of temperature.

The silicon oxide film is formed on the interdigital electrode by a chemical vapor disposition (CVD) method or by a sputtering method. The silicon oxide film formed by the CVD method has a low density. The low density of the silicon oxide film does not affect the propagation of elastic waves having frequencies of several tens MHz having long wavelengths; however, increases a propagation loss for elastic waves having frequencies of several hundreds MHz to several GHz having short wavelengths. The silicon oxide film of the elastic wave element allowing such a high frequency elastic wave to propagate is manufactured by the sputtering method.

The elastic wave element including the silicon oxide film manufactured by the sputtering method may change in its propagation characteristic of the elastic wave according to the change of environmental factor, such as an ambient temperature change.

Patent Document 1: JP2003-209458A

SUMMARY OF THE INVENTION

An elastic wave element includes a piezoelectric substrate, an interdigital electrode provided on the piezoelectric substrate, a silicon oxide film covering the interdigital electrode, and a silicon nitride oxide film provided on the silicon oxide film. A film thickness H of the silicon oxide film and a wave length λ of an elastic wave propagating through the piezoelectric substrate satisfies a relation of $H/\lambda \geq 0.15$.

The elastic wave element reduces fluctuation of propagation characteristics of elastic waves, and has high reliability.

REFERENCE NUMERALS

1 Piezoelectric Substrate
2 Interdigital Electrode
3 Silicon Oxide Film
4 Silicon Nitride Oxide Film
22 Interdigital Electrode
1001 Elastic Wave Element

DETAILED DESCRIPTION OF PREFERRED EMBODIMENT

Figure 1:
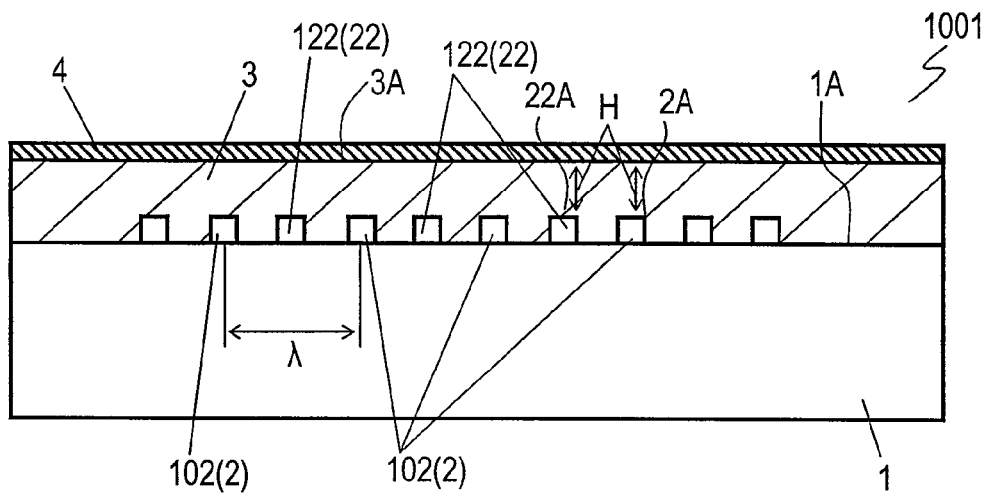
FIG. 1 is a cross sectional view of an elastic wave element according to an exemplary embodiment of the invention.

FIG. 1 is a cross sectional view of elastic wave element 1001 according to an exemplary embodiment of the invention. Elastic wave element 1001 is a surface acoustic wave element utilizing a surface acoustic wave as an elastic wave. Elastic wave element 1001 includes piezoelectric substrate 1, interdigital electrodes 2 and 22 provided upper surface 1A of piezoelectric substrate 1, silicon oxide film 3 made of silicon oxide provided on interdigital electrodes 2 and 22, and silicon nitride oxide film (silicon oxynitride film) 4 made of silicon nitride-oxide (silicon oxynitride) provided on silicon oxide film 3. Silicon oxide film 3 covers interdigital electrodes 2 and 22. Piezoelectric substrate 1 is a rotated Y-cut X-propagation lithium niobate substrate having a rotational angle of 5°. Interdigital electrodes 2 and 22 are made mainly of aluminum. Interdigital electrode 2 has plural electrode fingers 102. Interdigital electrode 22 has plural electrode fingers 122. Electrode fingers 102 and electrodes fingers 122 are arranged alternately. Elastic wave element 1001 according to the embodiment is a filter having a center frequency of about 2 GHz. The wave length of the elastic wave (surface acoustic wave) propagating piezoelectric substrate 1 is about 2 μm which is equal to pitches between electrode fingers 102 of interdigital electrode 2 and pitches between electrode fingers 122 of interdigital electrode 22. Interdigital electrodes 2 and 22 have a thicknesses of about 150 nm.

Silicon oxide film 3 reduces a change of characteristics, such as a frequency drift, of piezoelectric substrate 1 caused by a change of temperature, such as a thermal expansion of the substrate. Silicon oxide film 3 prevents interdigital electrodes 2 and 22 from short-circuiting. I order to reduce the change of the characteristics of piezoelectric substrate 1 due to a change in temperature, a film thickness H of silicon oxide film 3 and a wave length λ of the elastic wave satisfy the relation of $H/\lambda \geq 0.15$. The film thickness H of silicon oxide film 3 is a thickness from upper surfaces 2A and 22A of interdigital electrodes 2 and 22, namely, a distance from upper surfaces 2A and 22A of interdigital electrodes 2 and 22 to upper surface 3A of silicon oxide film 3. According to this embodiment, in the case that the wave length of the elastic wave is 2 μm, the film thickness H of silicon oxide film 3 is determined to be 400 nm which is larger than 300 nm which corresponds to the relation of $H/\lambda=0.15$. If upper surface 3A of silicon oxide film 3 is rough, the thickness is a distance from upper surfaces 2A and 22A of interdigital electrodes 2 and 22 to upper surface 3A of silicon oxide film 3 directly above upper surfaces 2A and 22A. The upper limit of the ratio H/λ is determined to allow elastic wave element 1001 to have an ordinary size as a product. For example, the ratio is determined based on the size of a case accommodating elastic wave element 1001 therein or on the size of a portion having elastic wave element 1001 mounted thereto.

Elastic wave element 1001 excluding silicon nitride oxide film 4 was produced as a comparative example of the elastic wave element. The comparative example was enclosed in an airtight container and left at temperature of 85° C. for 1000 hours as a high-temperature test. The center frequency of the comparative example changed by about −1000 ppm.

Silicon oxide film 3 of the comparative example of the elastic wave element was formed by a sputtering method using argon gas and silicon oxide substrate as a target material. Silicon oxide film 3 formed by this method has argon contained therein. When an environment, such as a temperature, is changed, the contained argon is discharged from silicon oxide film 3 to outside. This changes physical characteristics, such as an elastic modulus and a density, of silicon oxide film 3 caused a change of characteristics, the change of the center frequency, of the comparative example of the elastic wave element.

In elastic wave element 1001 according to the embodiment, silicon nitride oxide film 4 is formed on an upper surface 3A of silicon oxide film 3. Silicon nitride oxide film 4 is formed by a sputtering method using a silicon oxide plate as a target material and mixture gas of argon gas nitrogen gas as to vapor-deposit silicon nitride oxide on upper surface 3A of silicon oxide film 3. Silicon nitride oxide film 4 prevents argon contained in silicon oxide 3 from being discharged from silicon oxide film 3, and reduces the change of characteristics of elastic wave element 1001 according to temperature, thus providing elastic wave element 1001 with high reliability.

Figure 2:
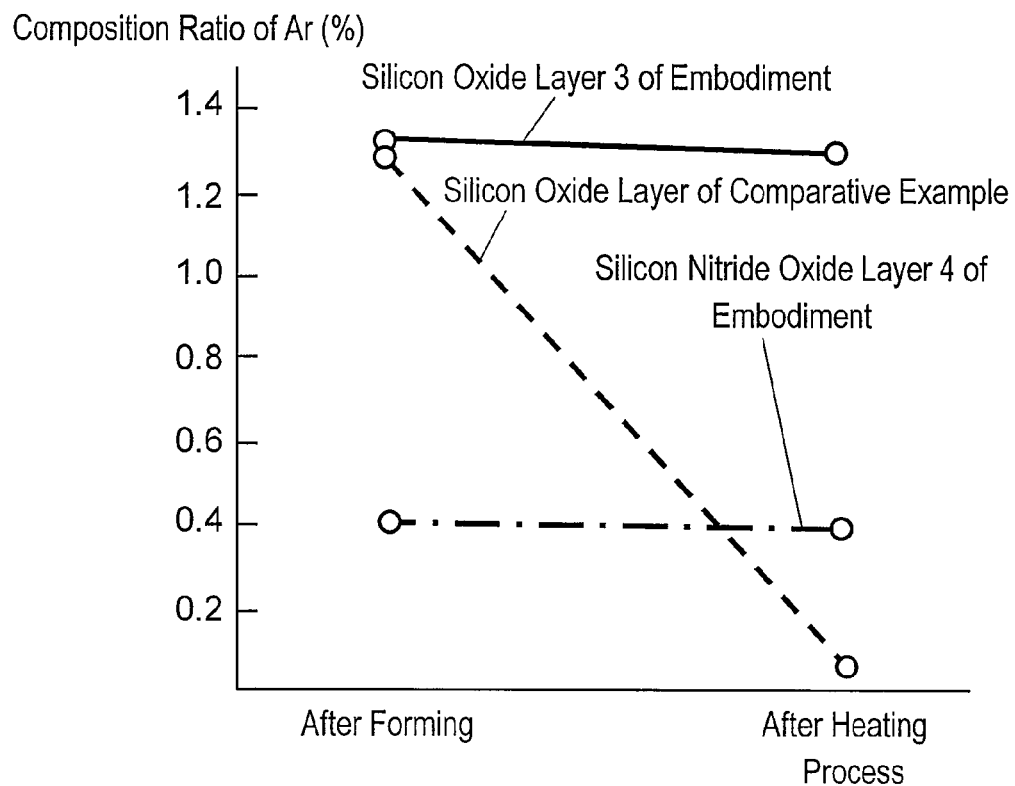
FIG. 2 shows a change of composition rates of argon in a silicon oxide film and a silicon nitride-oxide film of the elastic wave element according to the embodiment.

The comparative example of the elastic wave element and elastic wave element 1001 according to the embodiment was subject to an aging process to leave the elements at a temperature raised further by 300° C. for 12 hours. FIG. 2 shows a composition rate of argon contained in silicon oxide film 3 of the elastic wave elements. The composition rate of argon in silicon oxide film 3 of the comparative example before the aging process was about 1.3%, while the composition rate after the aging was less than 0.1%, which shows much argon was discharged.

In the comparative example of the elastic wave element, argon at upper surface 3A and vicinity of silicon oxide film 3 was discharged from silicon oxide film 3 during the aging process to produce depletion in the film. Argon near the depletion moves into the depletion and then the moving argon was discharged. These processes were repetitively executed and change physical characteristics, such as the elastic modulus and the density, of silicon oxide film 3, accordingly changing characteristics of the elastic wave element.

FIG. 2 shows a change of composition rates of argon contained in silicon nitride-oxide film 4 and silicon oxide film 3 of elastic wave element 1001 according to the embodiment. The composition rate of argon in silicon nitride oxide film 4 before and after the aging process was both about 0.4%, substantially no difference, which shows no argon was discharged during the aging process. The composition rate of argon in silicon oxide film 3 of the elastic wave element according to the embodiment before and after the aging process was both about 1.3%, substantially no difference. Thus, the elastic wave element reduced the change of the composition rate of argon in silicon oxide film 3 of elastic wave element 1001 due to the temperature, and reduced the change of the physical characteristics, such as the elastic modulus and the density, of silicon oxide film 3 due to the change in the temperature.

The elastic wave element including silicon nitride oxide film 4 was enclosed in an airtight container and was left at a temperature of 85° C. for 1000 hours for a high-temperature test. The change of the center frequency of the element was reduced to less than about −250 ppm.

In the comparative example of the elastic wave element, argon contained in silicon oxide film 3 is discharged during the aging process, and produces depletion in silicon oxide film 3 along a path through which the argon is discharged. The depletion allows humidity to enter easily via the path, and deteriorates resistance to humidity of the comparative example of the elastic wave element. Upon being sealed in an airtight package, the comparative example of the elastic wave element has its resistance to humidity improved, but such airtight package is expensive. Elastic wave element 1001 according to the embodiment prevents the contained argon from being discharged from silicon oxide film 3, and prevents silicon oxide film 3 from having therein the depletion, the path through which humidity enter. This allows elastic wave element 1001 according to the embodiment to be sealed with less expensive resin and to be manufactured at high productivity.

In the case that silicon oxide film 3 provided on interdigital electrodes 2 and 22 is thick, the elastic wave propagates not only on upper surface 1A of piezoelectric substrate 1 but also in a region including silicon oxide film 3. The comparative example of the elastic wave element has the depletion produced in silicon oxide film 3. The depletion causes a propagation loss of the elastic wave, and increases an insertion loss of the elastic wave element. However, the elastic wave element according to the embodiment prevents silicon oxide film 3 from having such depletion therein, accordingly reducing such insertion loss.

In an elastic boundary wave element in which an elastic wave propagates through a boundary between piezoelectric substrate 1 and an insulating film on upper surface 1A of piezoelectric substrate 1, a propagation loss in the insulating film easily affects the insertion loss of the elastic boundary wave element. Therefore, silicon nitride oxide film 4 according to the embodiment is preferably used in the elastic boundary wave element.

As described, silicon nitride oxide film 4 causing argon to stay in silicon oxide film 3 maintains a frequency stability of elastic wave element 1001 for a long time, and improves the resistance to humidity and electrical characteristics of the element.

Silicon nitride oxide film 4 has preferably a large thickness as to prevent argon from being discharged from silicon oxide film 3. A stress produced when silicon nitride-oxide film 4 is formed is greater than a stress produced when silicon oxide film 3 is formed. When an excessively large stress is produced on silicon nitride oxide film 4, the stress transmits through silicon oxide film 3 to piezoelectric substrate 1, and deteriorates intermodulation (IM) characteristics of interdigital electrodes 2 and 22.

According to an experiment to check deterioration of the IM characteristics executed by changing a ratio of the film thicknesses of silicon nitride-oxide film 4 and silicon oxide film 3, it was confirmed that the IM characteristics deteriorates much if the thickness of silicon nitride-oxide film 4 exceeds 3% of that of silicon oxide film 3.

In order to prevent argon from being discharged from silicon nitride oxide film 4, silicon nitride-oxide film needs to have a thickness not smaller than 3 nm. Silicon nitride oxide film 4 having a thickness less than 3 nm may not prevent the argon from being discharged. Namely, silicon nitride oxide film 4 deposited on silicon oxide film 3 has preferably a thickness not smaller than 3 nm and not larger than 3% of the thickness of silicon oxide film 3.

Elastic wave element 1001 has a relatively simple structure including interdigital electrodes 2 and 22 provided on piezoelectric substrate 1. The elastic wave element according to the embodiment provides various elastic wave devices, such as filters including plural interdigital electrodes 2 and 22, a diplexer, and a duplexer including these filters. The elastic wave element according to the embodiment is particularly useful to a transmission filter exhibiting the IM characteristics deteriorating due to large power and a duplexer including the transmission filter.

According to the embodiment, terms, such as "upper surface" and "directly above", suggesting directions indicates relative directions depending on relative positions of components, such as piezoelectric substrate 1, interdigital electrodes 2 and 22, silicon oxide film 3, and silicon nitride-oxide film 4, and not indicates absolute directions, such as a vertical direction.

INDUSTRIAL APPLICABILITY

An elastic wave element according to the present invention reduces fluctuation of propagation characteristics of elastic waves, and has high reliability, thus being useful for a high frequency circuit in communications equipment.

The invention claimed is:

1. An elastic wave element comprising:
a piezoelectric substrate;
an interdigital electrode provided on the piezoelectric substrate;
a silicon oxide film covering the interdigital electrode, the silicon oxide film containing argon; and
a silicon nitride oxide film provided on the silicon oxide film,
wherein a film thickness H of the silicon oxide film and a wave length $\lambda$ of an elastic wave propagating through the piezoelectric substrate satisfies a relation of $H/\lambda \geq 0.15$ and wherein a film thickness of the silicon nitride oxide film is not smaller than 3 nm and not larger than 3% of the film thickness of the silicon oxide film.

2. The elastic wave element according to claim 1, wherein the silicon nitride oxide film prevents the argon contained in the silicon oxide film from being discharged to an outside of the silicon oxide film.

3. The elastic wave element according to claim 1, wherein said elastic wave element is used in a transmission filter of a duplexer.

* * * * *